US012721212B2

(12) United States Patent
Ono

(10) Patent No.: US 12,721,212 B2
(45) Date of Patent: Aug. 25, 2026

(54) SEMICONDUCTOR DEVICE

(71) Applicant: ROHM CO., LTD., Kyoto (JP)

(72) Inventor: Tsunehisa Ono, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 366 days.

(21) Appl. No.: 18/465,657

(22) Filed: Sep. 12, 2023

(65) Prior Publication Data

US 2023/0420320 A1 Dec. 28, 2023

Related U.S. Application Data

(63) Continuation of application No. PCT/JP2022/007573, filed on Feb. 24, 2022.

(30) Foreign Application Priority Data

Mar. 17, 2021 (JP) ................................ 2021-043543

(51) Int. Cl.
*H10W 74/10* (2026.01)
*H10W 70/40* (2026.01)
(Continued)

(52) U.S. Cl.
CPC ........ *H10W 74/111* (2026.01); *H10W 70/417* (2026.01); *H10W 72/884* (2026.01); *H10W 90/736* (2026.01); *H10W 90/755* (2026.01)

(58) Field of Classification Search
CPC ........... H01L 23/3107; H01L 23/49513; H01L 24/48; H01L 24/32; H01L 24/73;
(Continued)

(56) References Cited

U.S. PATENT DOCUMENTS

2007/0262409 A1* 11/2007 Nozaki ............. H01L 23/49503 257/E23.045
2015/0194368 A1* 7/2015 Shimizu .............. H10W 70/411 438/123

(Continued)

FOREIGN PATENT DOCUMENTS

JP 2006-173504 6/2006
JP 2013-247131 12/2013

(Continued)

OTHER PUBLICATIONS

International Search Report issued in International Application No. PCT/JP2022/007573, May 10, 2022, 2 pages.

(Continued)

*Primary Examiner* — Christine A Enad
(74) *Attorney, Agent, or Firm* — HSML P.C.

(57) ABSTRACT

A semiconductor device includes: semiconductor element; first lead having first section carrying the semiconductor element; second lead separated from the first lead and connected to the semiconductor element; and resin section covering the semiconductor element and portions of the first and second leads. The first section has first obverse surface and first reverse surface mutually facing away in a thickness direction. The semiconductor element has element obverse surface and element reverse surface mutually facing away in the thickness direction. The element reverse surface faces the first obverse surface. The resin section has resin obverse surface and resin reverse surface mutually facing away in the thickness direction. The first reverse surface is exposed from the resin reverse surface, and the area ratio of the first reverse surface to a region surrounded by the outer edge of the resin reverse surface is between 40% and 50%.

20 Claims, 13 Drawing Sheets

(51) Int. Cl.
*H10W 72/00* (2026.01)
*H10W 90/00* (2026.01)

(58) Field of Classification Search
CPC ............. H10W 74/111; H10W 70/417; H10W 72/884; H10W 90/736; H10W 90/755
See application file for complete search history.

(56) References Cited

U.S. PATENT DOCUMENTS

| | | | |
|---|---|---|---|
| 2018/0151479 A1 | 5/2018 | Nishikizawa et al. | |
| 2021/0257274 A1* | 8/2021 | Tanaka ................. | H10D 12/481 |

FOREIGN PATENT DOCUMENTS

| | | | |
|---|---|---|---|
| JP | 2018-085480 | 5/2018 | |
| JP | 2020-090615 | 6/2020 | |
| WO | 2020/012958 | 1/2020 | |
| WO | WO-2020012958 A1 * | 1/2020 | ........... H10D 30/665 |

OTHER PUBLICATIONS

Written Opinion issued in International Application No. PCT/JP2022/007573, May 10, 2022, 3 pages.
Office Action issued in corresponding German Patent Application No. 11 2022 000 871.7, Oct. 23, 2025, 10 pages.
Office Action issued in corresponding Japan Patent Application No. 2023-506910, Mar. 10, 2026, 8 pages w/translation.

* cited by examiner 63
631
634
123
122
632
125
121
62
13
61
1
6
39
3
111
112
31
32
H0
α1
α2
H12
H61
H11
A1
y
z A1
221
222
22
23
2
21
211
212
64
641
642
61
62
7
1
311
6
39
3
111
112
31
32
H0
H22
H62
H21
α3
x
z

SEMICONDUCTOR DEVICE

TECHNICAL FIELD

The present disclosure relates to a semiconductor device.

BACKGROUND ART

Various types of semiconductor devices have been proposed that incorporate semiconductor elements. JP-A-2020-90615 discloses an example of a conventional semiconductor device. The semiconductor device disclosed in JP-A-2020-90615 includes a lead having an island section, a semiconductor element mounted on the island section, and a resin section covering the island section and the semiconductor element.

DETAILED DESCRIPTION OF EMBODIMENTS

Figure 1:
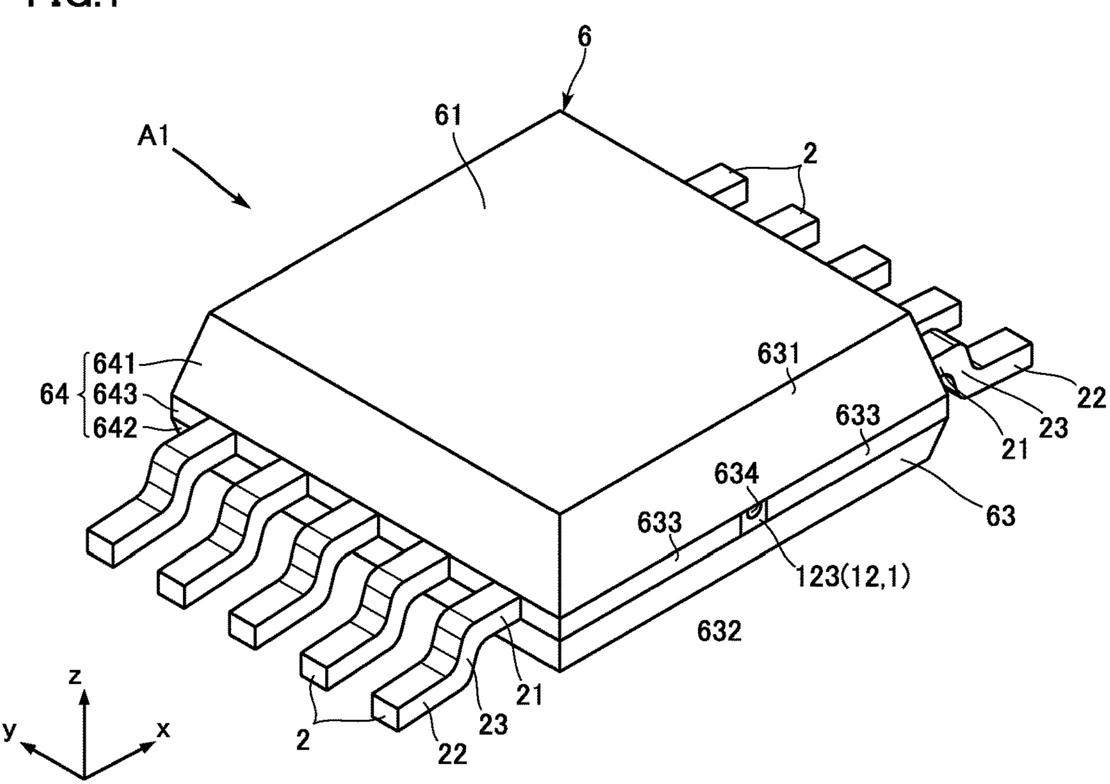
FIG. 1 is a perspective view illustrating a semiconductor device according to a first embodiment of the present disclosure.

The following describes a preferred embodiment of the present disclosure in detail with reference to the drawings.

The terms such as "first", "second" and "third" in the present disclosure are used merely as labels for identifying the elements accompanied with these terms and not intended to impose orders on the elements.

FIGS. 1 to 11 illustrate a semiconductor device according to a first embodiment of the present disclosure. The semiconductor device A1 in the present embodiment includes a first lead 1, a plurality of second leads 2, a semiconductor element 3, a plurality of wires 7, and a resin section 6. The package structure of the semiconductor device A1 may be referred to as a small outline package (SOP).

Figure 2:
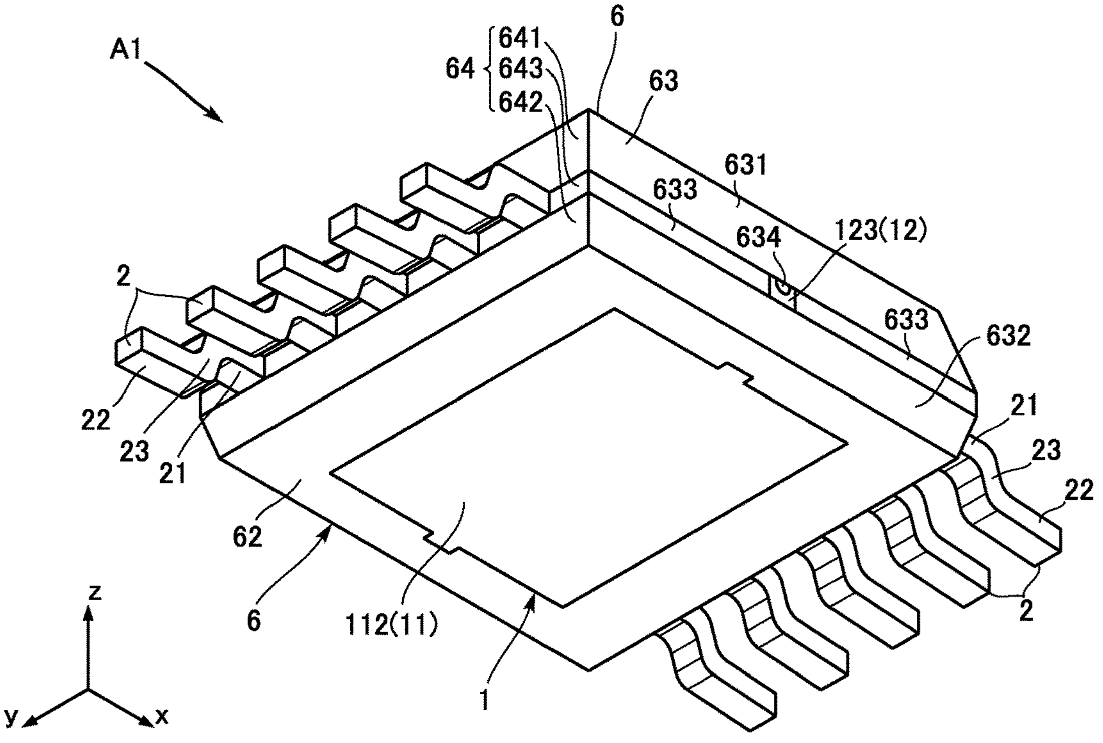
FIG. 2 is a perspective view illustrating the semiconductor device according to the first embodiment of the present disclosure.
Figure 3:
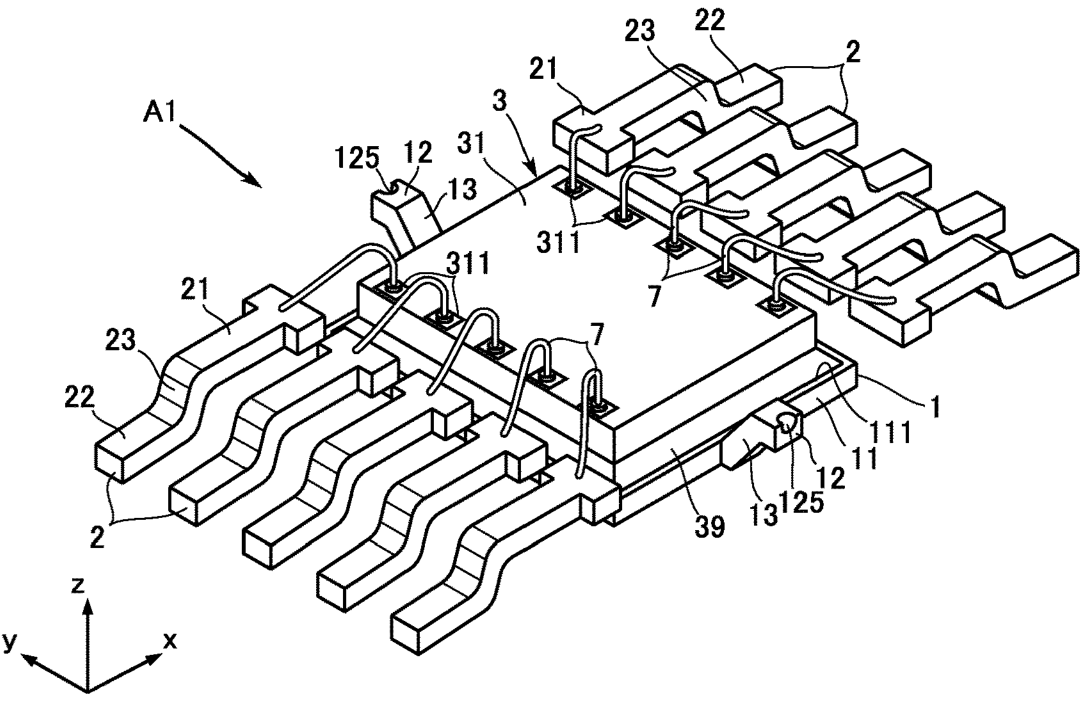
FIG. 3 is a perspective view illustrating main parts of the semiconductor device according to the first embodiment of the present disclosure.
Figure 4:
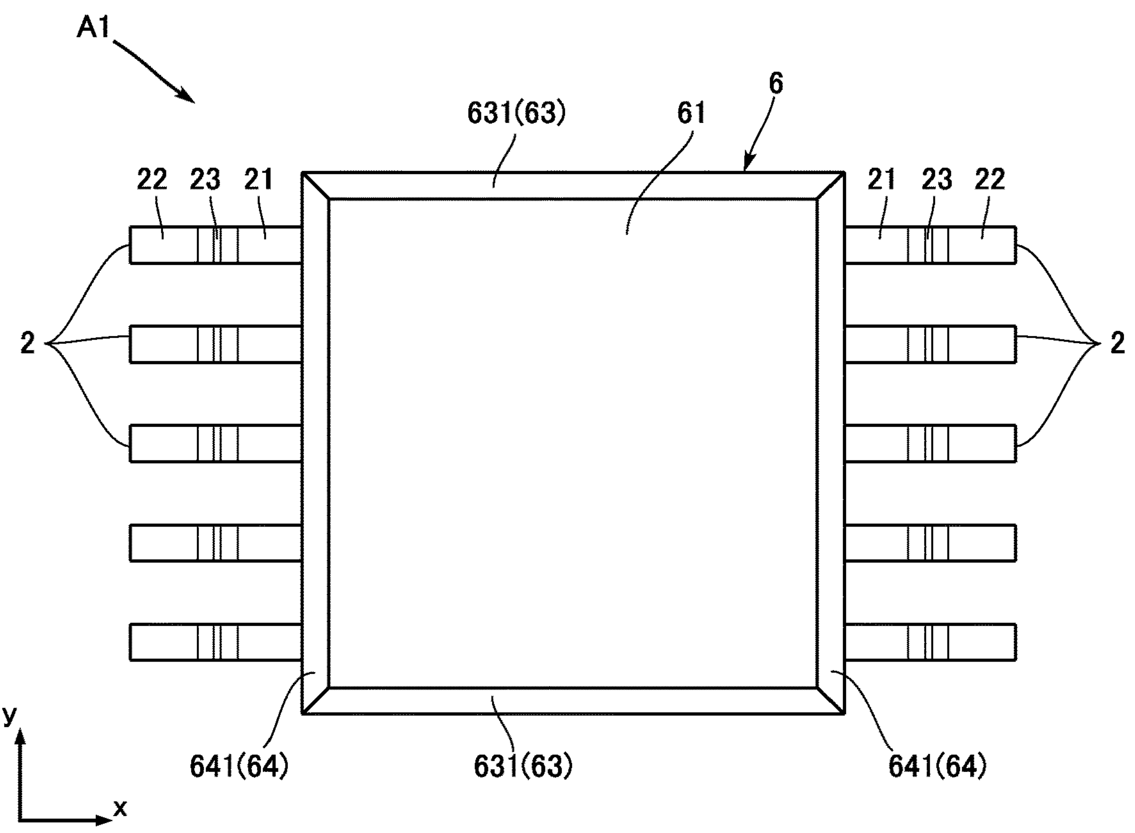
FIG. 4 is a plan view illustrating the semiconductor device according to the first embodiment of the present disclosure.
Figure 5:
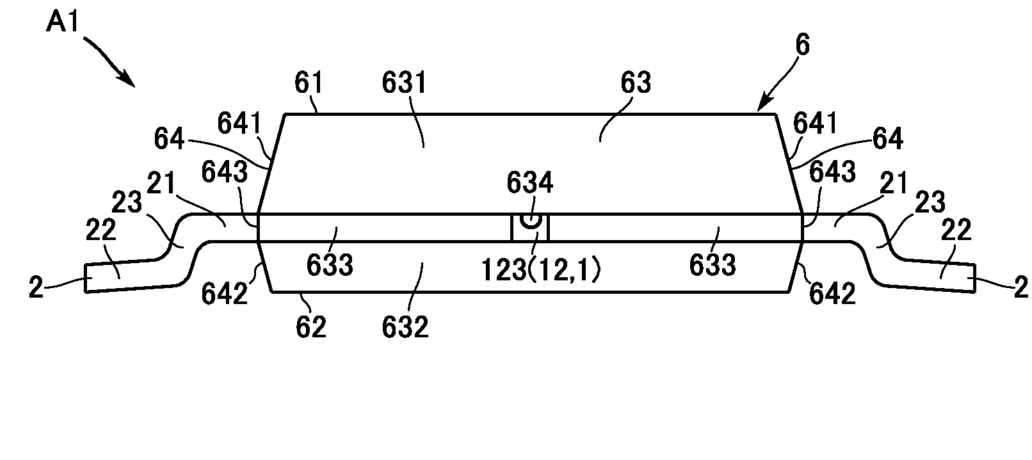
FIG. 5 is a front view illustrating the semiconductor device according to the first embodiment of the present disclosure.
Figure 6:
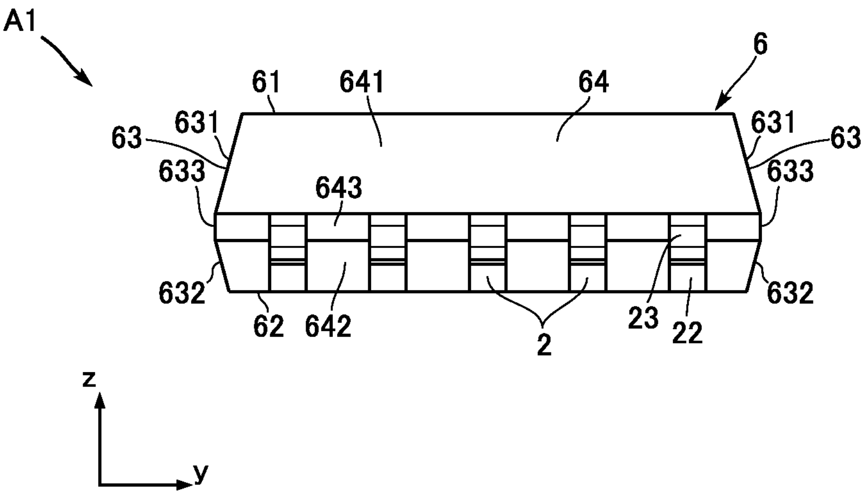
FIG. 6 is a side view illustrating the semiconductor device according to the first embodiment of the present disclosure.
Figure 7:
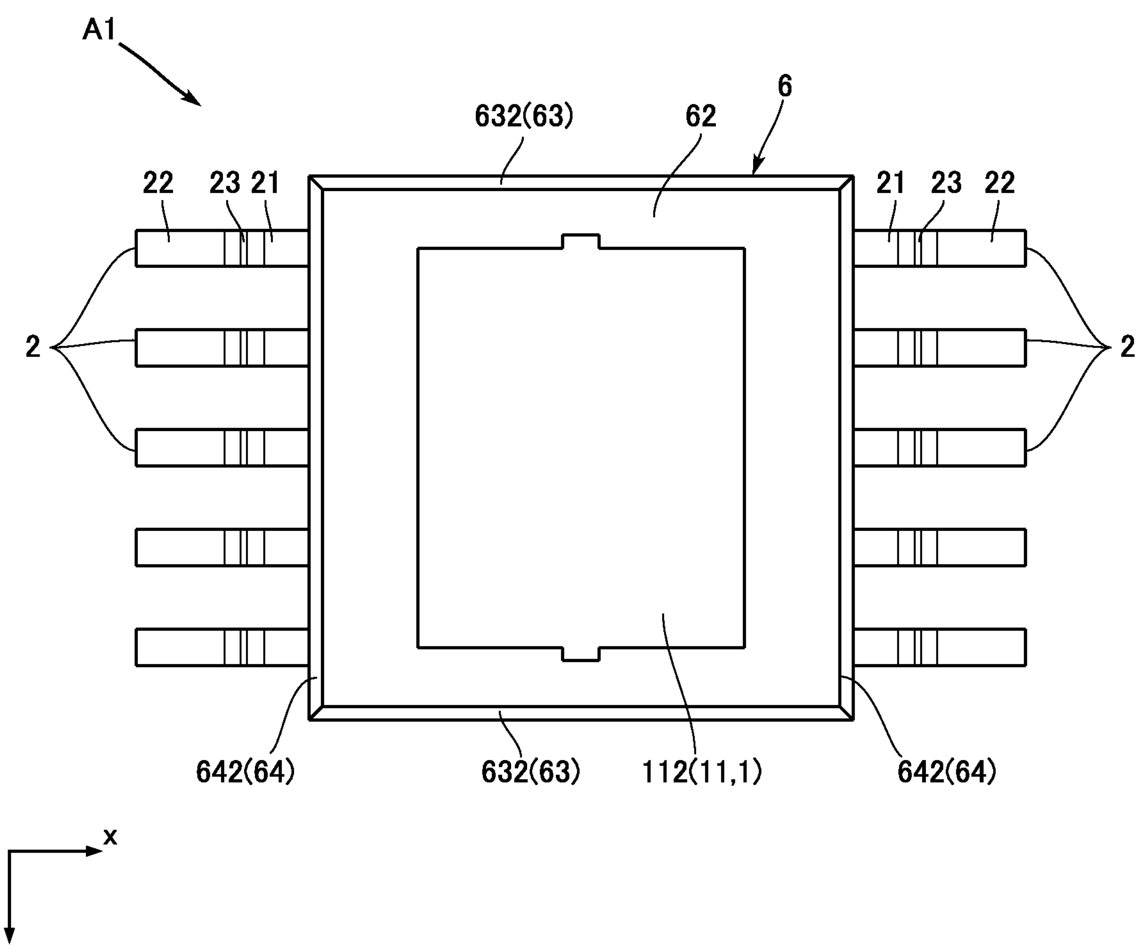
FIG. 7 is a bottom view illustrating the semiconductor device according to the first embodiment of the present disclosure.
Figure 8:
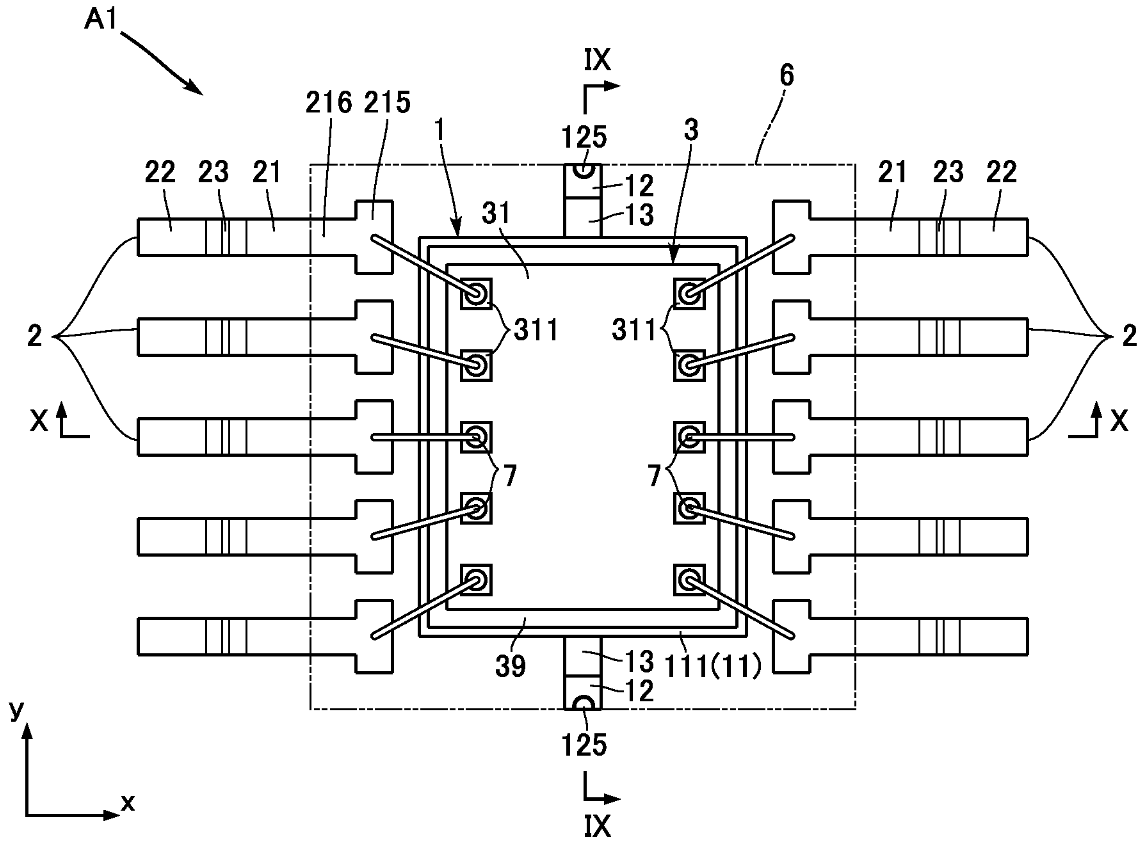
FIG. 8 is a plan view illustrating main parts of the semiconductor device according to the first embodiment of the present disclosure.
Figure 9:
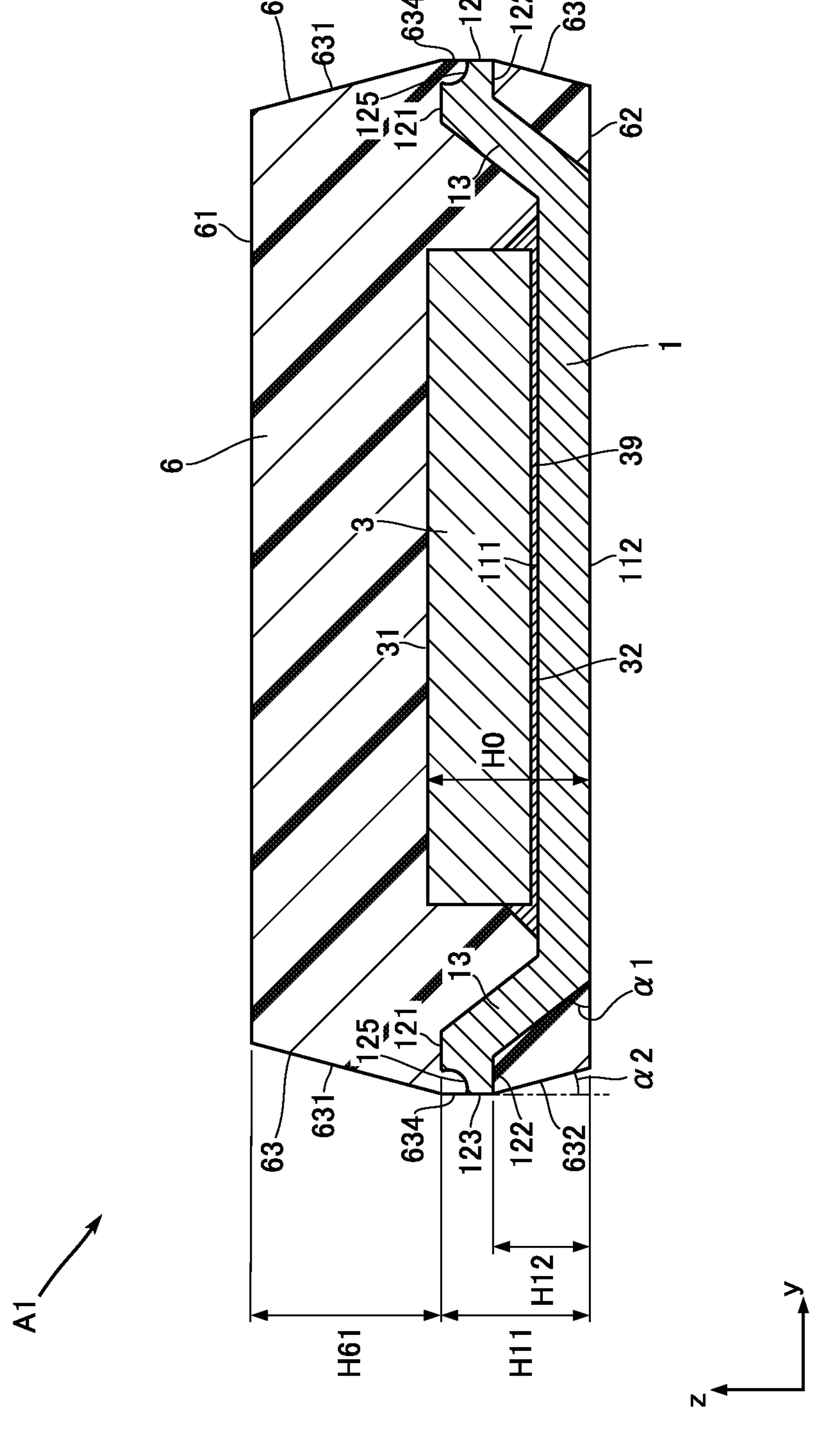
FIG. 9 is a cross-sectional view taken along line IX-IX in FIG. 8.
Figure 10:
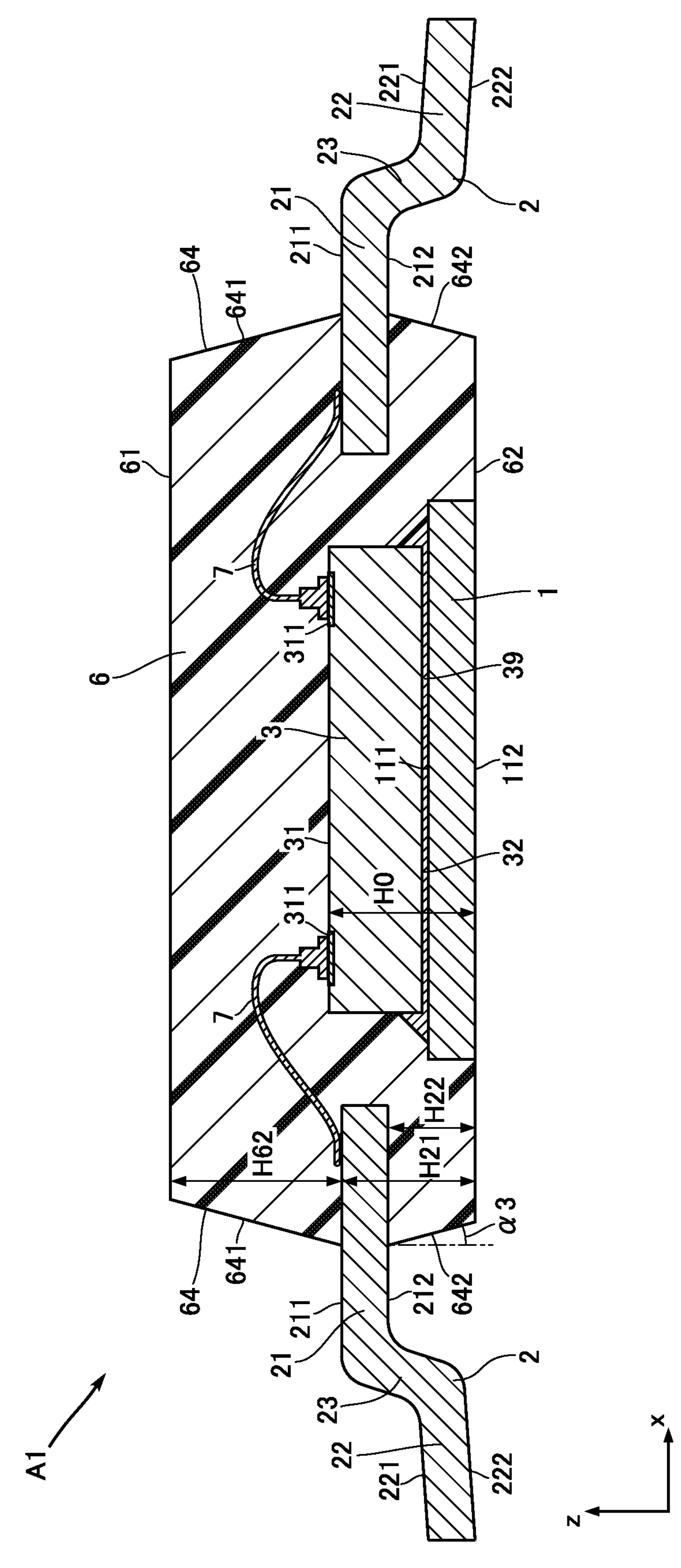
FIG. 10 is a cross-sectional view taken along line X-X in FIG. 8.
Figure 11:
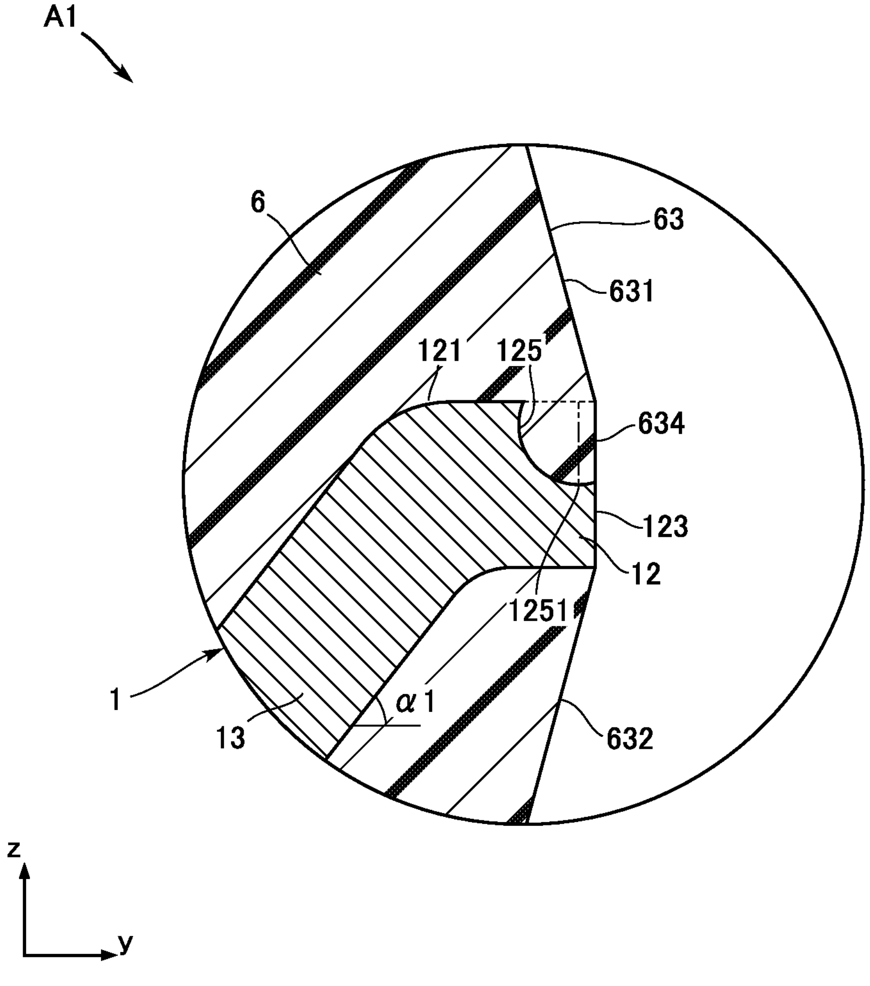
FIG. 11 is a partially enlarged cross-sectional view illustrating the semiconductor device according to the first embodiment of the present disclosure.

FIGS. 1 and 2 are perspective views illustrating the semiconductor device A1. FIG. 3 is a perspective view illustrating main parts of the semiconductor device A1. FIG. 4 is a plan view illustrating the semiconductor device A1. FIG. 5 is a front view illustrating the semiconductor device A1. FIG. 6 is a side view illustrating the semiconductor device A1. FIG. 7 is a bottom view illustrating the semiconductor device A1. FIG. 8 is a plan view illustrating main parts of the semiconductor device A1. FIG. 9 is a cross-sectional view taken along line IX-IX in FIG. 8. FIG. 10 is a cross-sectional view taken along line X-X in FIG. 8. FIG. 11 is a partially enlarged cross-sectional view illustrating the semiconductor device A1. In these figures, the z direction is an example of a thickness direction, the y direction is an example of a first direction, and the x direction is an example of a second direction.

The first lead 1 is a member for supporting the semiconductor element 3, and is formed by cutting and bending a metal plate material made of Cu or a Cu alloy, for example. As shown in FIGS. 1 to 3, 5, and 7 to 11, the first lead 1 of the present embodiment has a first section 11, two second sections 12, and two third sections 13. The first lead 1 may have a thickness of 0.1 mm to 0.5 mm, and a specific example of the thickness is approximately 0.15 mm.

The first section 11 is where the semiconductor element 3 is mounted. The shape of the first section 11 is not particularly limited. In the illustrated example, the first section 11 has a rectangular shape. The first section 11 has a first obverse surface 111 and a first reverse surface 112. The first obverse surface 111 faces in a first sense of the z direction (upper side in the figures). The first obverse surface 111 is covered with the resin section 6. The first reverse surface 112 faces in a second sense of the z direction (lower side in the figures). The first reverse surface 112 is exposed from the resin section 6. The size of the first section 11 is not particularly limited. In the case where the first section 11 has a rectangular shape, the length of one side of the rectangle may be approximately 1.5 mm to 3.0 mm.

The two second sections 12 flank the first section 11 in the y direction, and are offset from the first section 11 in the sense of the z direction in which the first obverse surface 111 faces. The shape of each second section 12 is not particularly limited. In the illustrated example, the shape of each second section 12 has a dimension (width) that is substantially constant in the x direction. The dimension of each second section 12 in the x direction is not particularly limited, and may be approximately 0.2 mm. Each of the second sections 12 has a second obverse surface 121, a second reverse surface 122, a second end surface 123, and a recess 125.

The second obverse surface 121 faces in the first sense of the z direction (upper side in the figures). The second reverse surface 122 faces in the second sense of the z direction (lower side in the figures). The second obverse surface 121 and the second reverse surface 122 are covered with the resin section 6. The second end surface 123 faces outward in the y direction. The second obverse surface 121 and the second reverse surface 122 are planes substantially parallel to the x direction and the y direction. The second end surface 123 is exposed from the resin section 6.

The recess 125 is recessed from the second obverse surface 121 in the z direction. In the illustrated example, the recess 125 is open in the second end surface 123 in the y direction. The shape of the recess 125 is not particularly limited. In the illustrated example, the recess 125 has a shape formed with an arc and a chord, and is spaced apart from both ends of the second section 12 in the x direction. The depth of the recess 125 in the z direction is not particularly limited, and is approximately 0.075 mm, for example. As shown in FIG. 11, the recess 125 has the deepest section 1251 in the z direction, which is positioned inward from the second end surface 123 in the y direction. The recess 125 is filled with a portion of the resin section 6.

Each of the two third sections 13 is located between the first section 11 and a corresponding one of the two second sections 12. The third sections 13 are covered with the resin section 6. The third sections 13 are inclined relative to the y direction. The dimension of each third section 13 in the x direction is not particularly limited, and may be approximately 0.2 mm. As shown in FIGS. 9 and 11, an angle $\alpha 1$, which is the angle formed by each of the third sections 13 and the y direction, is between 50° and 70°, both inclusive, and is preferably between 50° and 55°, both inclusive. In the illustrated example, the angle $\alpha 1$ may be approximately 52°.

The second leads 2 are used as terminals for mounting the semiconductor device A1, and are electrically connected to the semiconductor element 3. The second leads 2 are formed by cutting and bending a metal plate material made of Cu or a Cu alloy, for example. As shown in FIGS. 1 to 10, the second leads 2 are spaced apart from the first section 11 in the x direction. In the present embodiment, the second leads 2 are divided in two groups arranged on the respective sides of the first section 11 in the x direction. The second leads 2 are arranged in the y direction at equal pitches. In the present embodiment, each of the second leads 2 has a fourth section 21, a fifth section 22, and a sixth section 23. Each of the second leads 2 may have a thickness of 0.1 mm to 0.5 mm, and a specific example of the thickness is approximately 0.15 mm.

The fourth section 21 is covered with the resin section 6, and is offset from the first section 11 in the sense of the z direction in which the first obverse surface 111 faces. The fourth section 21 has a fourth obverse surface 211 and a fourth reverse surface 212. The fourth obverse surface 211 faces in the first sense of the z direction (upper side in the figures). The fourth reverse surface 212 faces in the second sense of the z direction (lower side in the figures).

In the present embodiment, the fourth section 21 has a bonding section 215 and a strip section 216. The bonding section 215 is where the wire 7 is bonded. The strip section 216 is connected to the bonding section 215 at the side opposite from the first section 11 in the x direction. The dimension of the bonding section 215 in the y direction is larger than the dimension of the strip section 216 in the y direction. The dimension of the bonding section 215 in the y direction is approximately 0.4 mm, for example, and the dimension of the strip section 216 in the y direction is approximately 0.2 mm, for example. In the fourth section 21, the bonding section 215 and a portion of the strip section 216 are covered with the resin section 6, and the other portion of the strip section 216 is exposed from the resin section 6.

The fifth section 22 is located outward relative to the fourth section 21 in the x direction, and is offset from the fourth section 21 in the sense of the z direction in which the fourth reverse surface 212 faces. The fifth section 22 is exposed from the resin section 6. The dimension of the fifth section 22 in the y direction is approximately 0.2 mm, for example. In the illustrated example, the fifth section 22 overlaps with the first section 11 as viewed in the y direction. The fifth section 22 has a fifth obverse surface 221 and a fifth reverse surface 222. The fifth obverse surface 221 faces in the first sense of the z direction (upper side in the figures). The fifth reverse surface 222 faces in the second sense of the z direction (lower side in the figures).

The sixth section 23 is located between the fourth section 21 and the fifth section 22. The sixth section 23 is exposed from the resin section 6. The sixth section 23 is inclined relative to the x direction. The dimension of the sixth section 23 in the y direction is approximately 0.2 mm, for example.

The semiconductor element 3 performs an electrically major function in the semiconductor device A1. The semiconductor element 3 is not limited to a specific example, and may be an LSI or IC. The semiconductor element 3 is not limited to a particular shape or size. As shown in FIGS. 3 and 8, the semiconductor element 3 of the present embodiment may have a rectangular shape smaller than the first section 11 as viewed in the z direction. As shown in FIGS. 9 and 10, the semiconductor element 3 has an element obverse surface 31 and an element reverse surface 32. The element obverse surface 31 faces in the first sense of the z direction (upper side in the figures). The element reverse surface 32 faces in the second sense of the z direction (lower side in the figures).

The element obverse surface 31 is provided with a plurality of electrode pads 311. For example, the electrode pads 311 are arranged in two lines in the y direction on the element obverse surface 31. The element reverse surface 32 is bonded to the first obverse surface 111 of the first section 11 via a bonding member 39. The bonding member 39 may be a conductive bonding member such as solder or Ag paste, or may be an insulating bonding member such as an epoxy adhesive.

The wires 7 electrically connect the semiconductor element 3 and the second leads 2. As shown in FIGS. 3 and 8, the wires 7 are respectively bonded to the electrode pads 311 of the semiconductor element 3 and the bonding sections 215 of the fourth sections 21 of the second leads 2. The wires 7 are made of Au, A1, or Cu, for example, and are made of Au in the present embodiment.

The resin section 6 covers a portion of the first lead 1, a portion of each of the second leads 2, the semiconductor element 3, and the wires 7. The resin section 6 is made of an insulating resin, such as a black epoxy resin containing fillers. As shown in FIGS. 1, 2, and 4 to 11, the resin section 6 of the present embodiment has a resin obverse surface 61, a resin reverse surface 62, two resin first side surfaces 63, and two resin second side surfaces 64.

The resin obverse surface 61 faces in the first sense of the z direction (upper side in the figures). The resin reverse surface 62 faces in the second sense of the z direction (lower side in the figures). In the present embodiment, the resin obverse surface 61 has a rectangular shape. As shown in FIG. 7, for example, the first reverse surface 112 is exposed from the resin reverse surface 62, and the resin reverse surface 62 has an annular shape. The outer periphery edge of the resin reverse surface 62 has a rectangular shape. The area ratio of the first reverse surface 112 to the area surrounded by the outer periphery edge of the resin reverse surface 62 is between 40% and 50%, both inclusive, preferably between 42% and 44%, both inclusive.

The two resin first side surfaces 63 are positioned between the resin obverse surface 61 and the resin reverse surface 62 and in the respective senses of the y direction. In the present embodiment, each of the resin first side surfaces 63 has a first region 631, a second region 632, a third region 633, and a fourth region 634.

The first region 631 is located between the resin obverse surface 61 and the second obverse surface 121 in the z direction. The second region 632 is located between the second reverse surface 122 and the resin reverse surface 62. As shown in FIG. 9, an angle α2, which is the angle formed by the second region 632 and the z direction, is in the range of 15° to 30°, preferably in the range of 15° to 25°.

The third region 633 is located between the second obverse surface 121 and the second reverse surface 122 in the z direction, and is adjacent to the second end surface 123 in the x direction. In the present embodiment, each of the resin first side surfaces 63 has two third regions 633.

The fourth region 634 is an exposed surface of the portion of the resin section 6 that is filled in the recess 125, and faces in the y direction. In the present embodiment, the fourth region 634 has a shape formed with an arc and a chord. In the present embodiment, the second end surface 123 is flush with the two third regions 633 and the fourth region 634. The second end surface 123 is surrounded by the resin obverse surface 61, the resin reverse surface 62, the two third regions 633, and the fourth region 634. As shown in FIG. 11, the deepest section 1251 of the recess 125 is located inward from the fourth region 634 in the y direction.

The two resin second side surfaces 64 are positioned between the resin obverse surface 61 and the resin reverse surface 62 and in the respective senses of the x direction. In the present embodiment, each of the resin second side surfaces 64 has a fifth region 641, a sixth region 642, and a seventh region 643.

The fifth region 641 is located between the resin obverse surface 61 and the fourth obverse surface 211 in the z direction. The sixth region 642 is located between the fourth reverse surface 212 and the resin reverse surface 62. As shown in FIG. 10, an angle α3, which is the angle formed by the sixth region 642 and the z direction, is in the range of 15° to 30°, preferably in the range of 15° to 25°. In this embodiment, the angle α2 and the angle α3 are the same angle (α2=α3).

The seventh region 643 is located between the fourth obverse surface 211 and the fourth reverse surface 212 in the z direction, and is adjacent to the fourth sections 21 in the x direction. In the present embodiment, each of the resin second side surfaces 64 has six seventh regions 643.

As shown in FIG. 9, in the present embodiment, a height H11, which is the distance between the first reverse surface 112 and the second obverse surface 121 in the z direction, is at least 0.6 times and less than 1.0 times and preferably 0.7 to 0.8 times a height H0, which is the distance between the first reverse surface 112 and the element obverse surface 31. Furthermore, the height H11 is 1.5 to 2.4 times and preferably 1.5 to 2.0 times a height H12, which is the distance between the first reverse surface 112 and the second reverse surface 122. The dimension of the second region 632 in the z direction is the height H12, and the height H12 is lower than a height H61, which is the dimension of the first region 631 in the z direction.

As shown in FIG. 10, in the present embodiment, a height H21, which is the distance between the first reverse surface 112 and the fourth obverse surface 211 in the z direction, is at least 0.6 times and less than 1.0 times, preferably 0.7 to times, the height H0. Furthermore, the height H21 is 1.5 to 2.4 times and preferably 1.5 to 2.0 times a height H22, which is the distance between the first reverse surface 112 and the fourth reverse surface 212. The dimension of the sixth region 642 in the z direction is the height H22, and the height H22 is lower than a height H62, which is the dimension of the fifth region 641 in the z direction.

Figure 12:
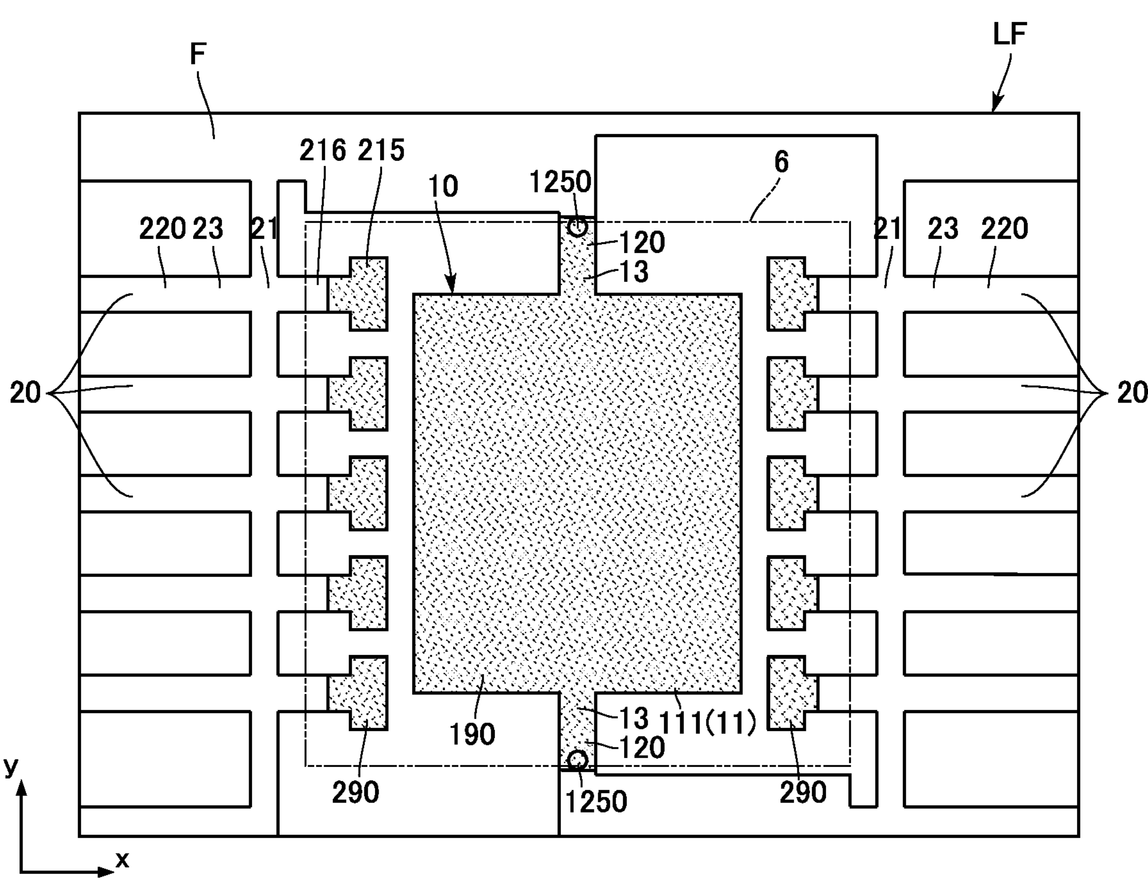
FIG. 12 is a plan view illustrating an example of a lead frame used in a method for manufacturing the semiconductor device according to the first embodiment of the present disclosure.

FIG. 12 illustrates a lead frame LF, which is an example of a member used in the manufacturing of the semiconductor device A1. The lead frame LF includes a frame F, as well as a lead 10 and a plurality of leads 20 that are connected to the frame F. The lead 10 and the leads 20 will form the first lead 1 and the second leads 2 once the lead frame LF is cut. The lead 10 has two second sections 120. The second sections 120 will form the second sections 12 and each have a recess 1250. The recess 1250 is a circular recess as viewed in the z direction.

In the illustrated example, the lead frame LF is formed with a plating section 190 and a plating section 290. The plating section 190 and the plating section 290 are formed by Ag or Ni plating layers, for example. The plating section 190 is formed on the first obverse surface 111 of the first section 11, and on the illustrated surfaces of the second sections 120 and the third sections 13. The plating section 290 is formed on the illustrated surfaces of the bonding sections 215 of the fourth sections 21 and portions of the strip sections 216. As such, in the semiconductor device A1, the plating section 190 is formed on the first section 11, the second sections 12, and the third sections 13, and the plating section 290 is formed on the bonding sections 215 and the strip sections 216 of the second leads 2. Alternatively, it is possible to employ a configuration without the plating section 190 or the plating section 290, or a configuration where the plating section 190 and the plating section 290 are formed in different areas.

Figure 13:
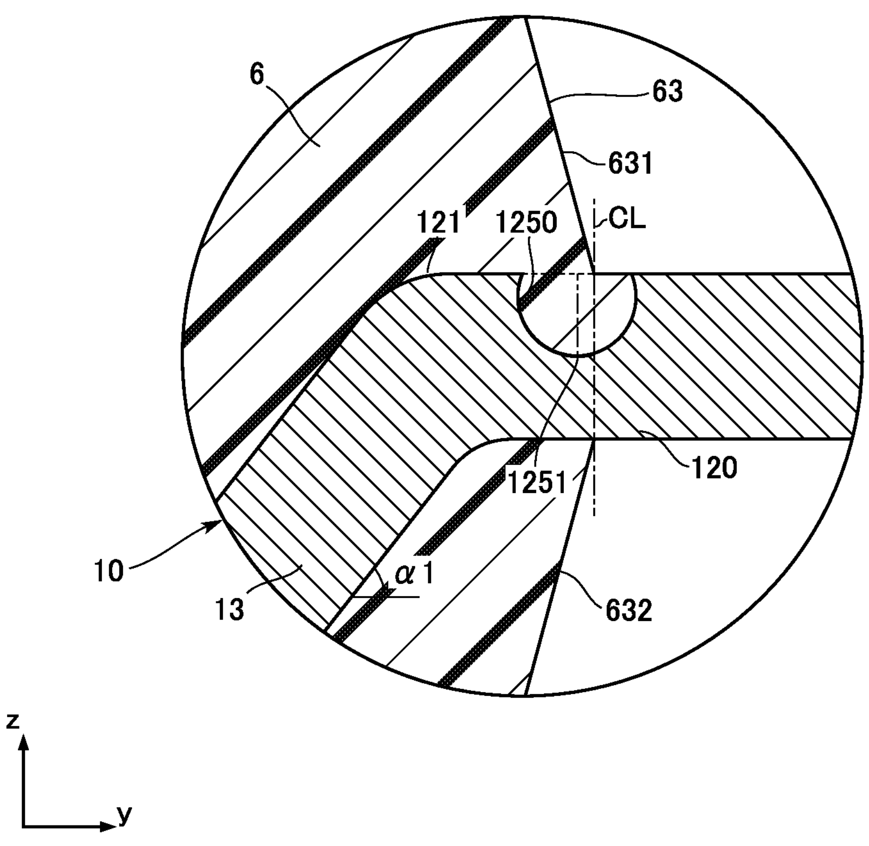
FIG. 13 is a partially enlarged cross-sectional view illustrating the method for manufacturing the semiconductor device according to the first embodiment of the present disclosure.

As shown in FIG. 13, the resin section 6 is formed by, for example, molding, after the semiconductor element 3 is mounted on the lead frame LF and the wires 7 are bonded to the lead frame LF. Each of the recesses 1250 will be filled with a portion of the resin section 6 in the illustrated shape, for example. Each of the deepest sections 1251 is the center of the recess 1250 as viewed in the z direction, and is positioned inward from the third regions 633 in the x direction. The second end surface 123 and the fourth region 634 as shown in FIG. 11 are formed when the lead frame LF is cut along a cut line CL in the figure with use of a mold or the like.

The following describes advantages of the semiconductor device A1.

According to the present embodiment, the area ratio of the first reverse surface 112 to the area surrounded by the outer periphery edge of the resin reverse surface 62 is between 40% and 50%, both inclusive, preferably between 42% and 44%, both inclusive. This makes it possible to increase the area of the first reverse surface 112, which serves as a path for dissipating heat from the semiconductor element 3, while suppressing an increase of the size (the area surrounded by the outer periphery edge of the resin reverse surface 62) of the semiconductor device A1, as compared to the configuration where the area ratio is smaller than 40%. Accordingly, the semiconductor device A1 can facilitate heat dissipation from the semiconductor element 3.

As shown in FIG. 9, the angle $\alpha$1 is between 50° and 70°, both inclusive, and is preferably between 50° and 55°, both inclusive. In this way, the second sections 12 can be brought closer to the first section 11 without increasing the bend angle between the first section 11 and each of the third sections 13 excessively. This is advantageous in achieving the area ratio described above.

The height H11 is at least 0.6 times and less than 1.0 times, preferably 0.7 to 0.8 times, the height H0. The height H11 is 1.5 to 2.4 times, preferably 1.5 to 2.0 times, the height H12. The height H12 is lower than the height H61, which is the dimension of the first region 631 in the z direction. These numerical ranges allow the height H12 to be relatively low, which is advantageous for bringing the second sections 12 closer to the first section 11.

As shown in FIG. 10, the height H21 is at least 0.6 times and less than 1.0 times, preferably 0.7 to 0.8 times, the height H0. The height H21 is 1.5 to 2.4 times, preferably 1.5 to 2.0 times, the height H22. The height H22 is lower than the height H62. In the manufacturing of the semiconductor device A1, it is preferable that the height H21 be set to the same height as the height H11, and that the height H22 be set to the same height as the height H12. Accordingly, these numerical ranges also contribute to bringing the second sections 12 closer to the first section 11.

As shown in FIG. 9, the angle $\alpha$2 is in the range of 15° to 30°, preferably in the range of 15° to 25°. As shown in FIG. 10, the angle $\alpha$3 is in the range of 15° to 30°, preferably in the range of 15° to 25°. The research by the present inventor shows that employing these numerical ranges can reduce the stress generated when the lead frame LF is cut.

As shown in FIGS. 9 and 11, each of the second sections 12 of the first lead 1 is formed with a recess 125. The recess 125 is obtained as a result of cutting a recess 1250 in the manufacturing method shown in FIG. 13. Since the recesses 1250 are formed in the respective second sections 12 of the lead 10, the force received by the resin section 6 during the cutting of the second sections 120 can be reduced. This makes it possible to suppress cracks and damages of the resin section 6 in the second region 632 and the sixth region 642 when the height H12 and the height H22 shown in FIGS. 9 and 10 are set to be lower. This configuration is thus suitable for achieving the area ratio described above.

Figure 14:
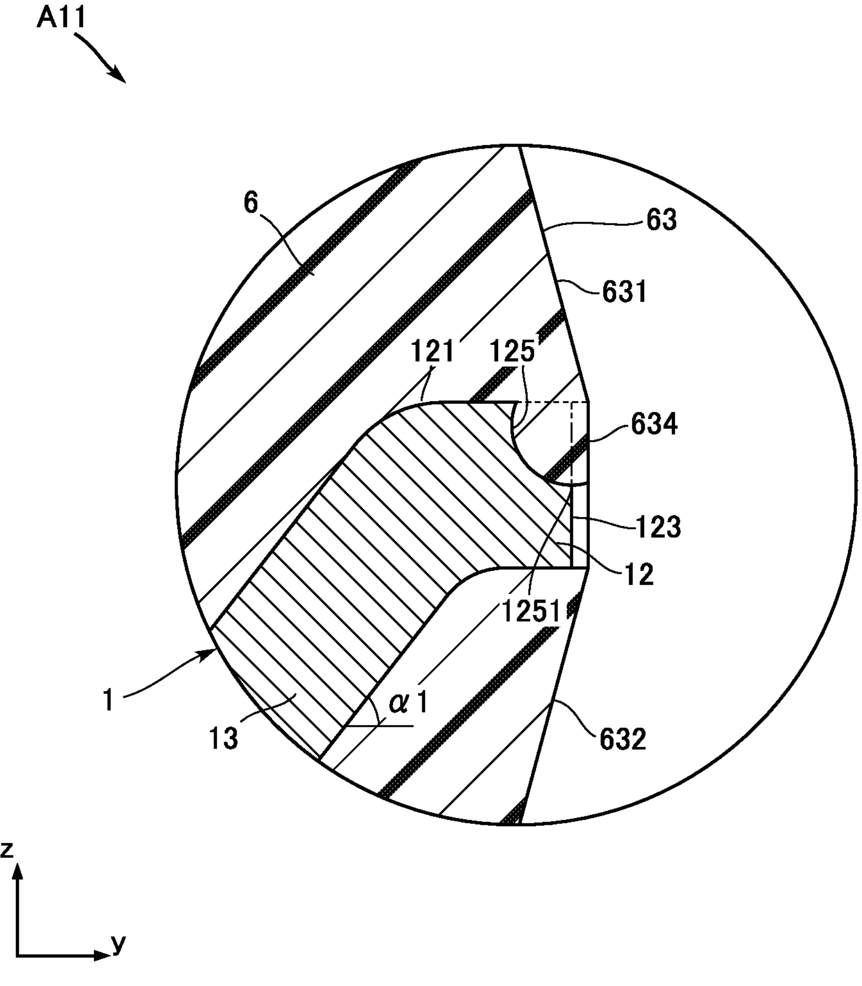
FIG. 14 is a partially enlarged cross-sectional view illustrating a first variation of the semiconductor device according to the first embodiment of the present disclosure.

Each of the recesses 125 is spaced apart from both ends of the second section 12 in the x direction. In this way, the resin material filled in the recesses 125 to form the resin section 6 can be prevented from leaking accidentally in the x direction. Furthermore, each of the deepest sections 1251 is positioned inward from the third regions 633 in the y direction. For example, when each of the second sections 120 is cut at the position intersecting with the deepest section 1251 in the manufacturing method shown in FIG. 13, the configuration of a semiconductor device A11 of a first variation, which is shown in FIG. 14, is formed. In other words, each of the second end surfaces 123 is located inward from the fourth region 634 (third regions 633) in the y direction. In such a configuration, each of the second sections 12 (second end surfaces 123) do not protrude outward from the fourth region 634 (third regions 633) in the y direction, thereby preventing accidental snagging or the like. This makes it possible to more suitably respond to variations in the cutting positions of the second sections 12.

Figure 15:
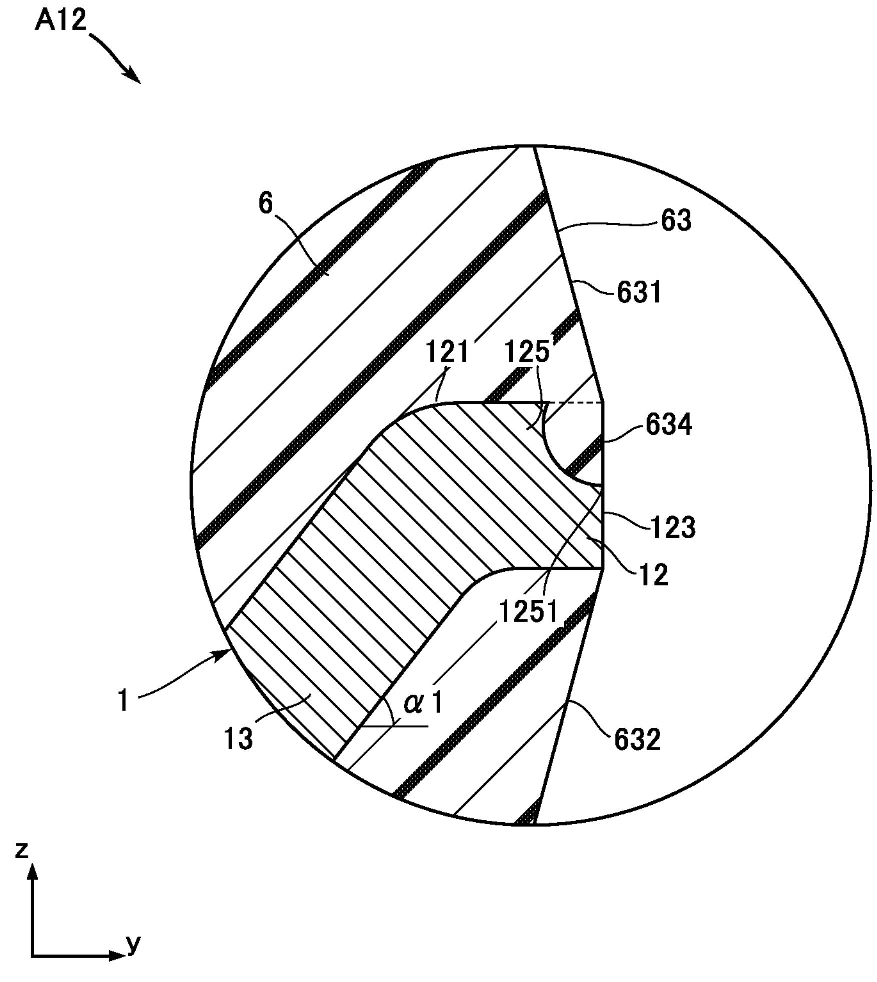
FIG. 15 is a partially enlarged cross-sectional view illustrating a second variation of the semiconductor device according to the first embodiment of the present disclosure.
Figure 16:
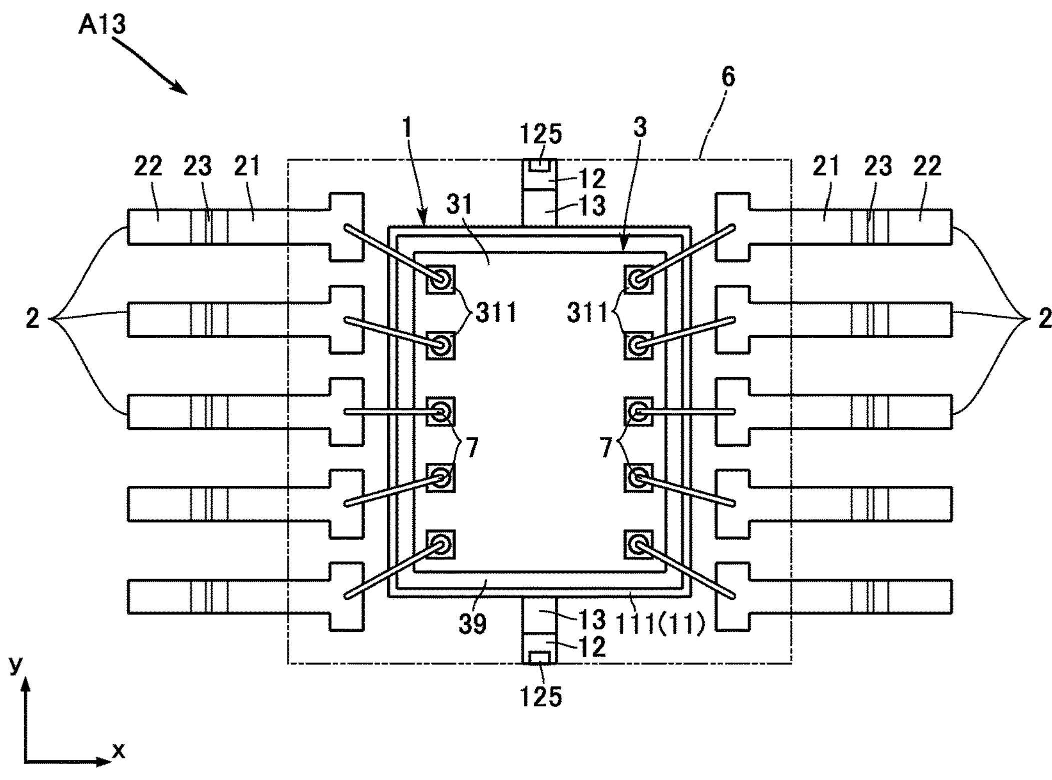
FIG. 16 is a plan view illustrating a third variation of the semiconductor device according to the first embodiment of the present disclosure.
Figure 17:
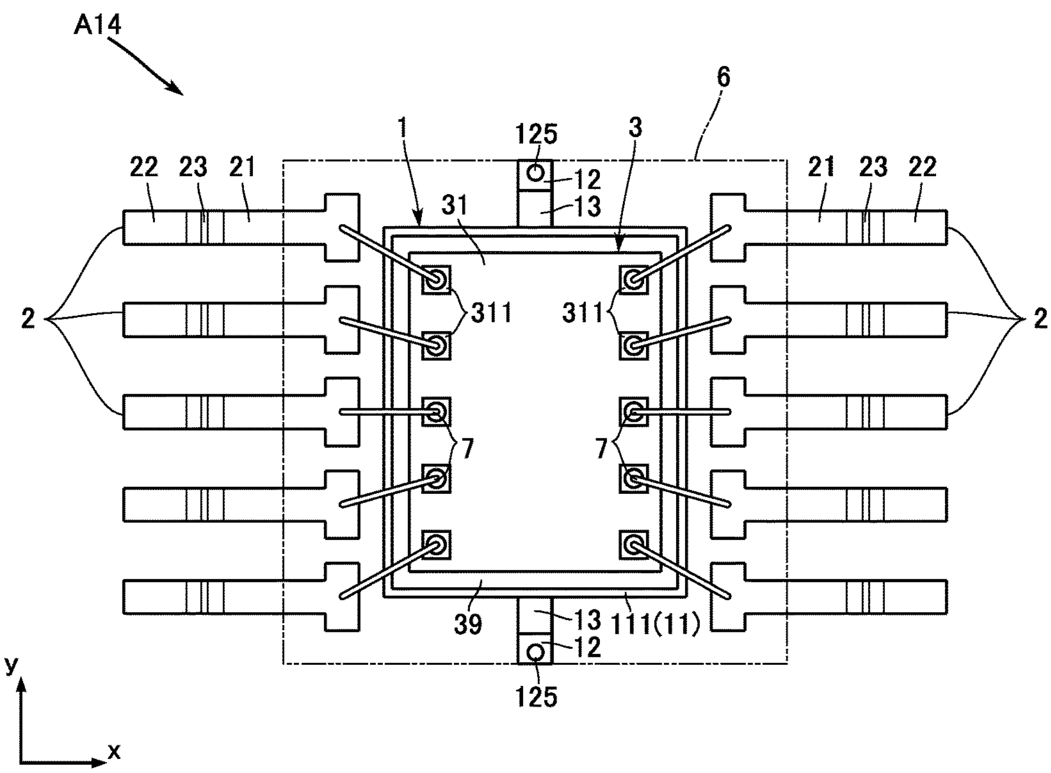
FIG. 17 is a plan view illustrating a fourth variation of the semiconductor device according to the first embodiment of the present disclosure.

FIGS. 15 to 17 show other variations of the present disclosure. In these figures, elements that are the same as or similar to the elements in the above embodiment are provided with the same reference signs as in the above embodiment.

FIG. 15 shows a second variation of the semiconductor device A1. A semiconductor device A12 of the present variation is different from the semiconductor device in the above embodiment in the configuration of the recesses 125. In the present variation, the deepest section 1251 of each recess 125 is provided at substantially the same position as the fourth region 634 in the y direction. The semiconductor device A12 having this configuration can be formed in the manufacturing method described with reference to FIG. 13 by cutting the resin section 6 and each of the second sections 12 of the lead frame LF along the cut line CL intersecting the deepest section 1251.

The semiconductor device A12 of the present variation can also facilitate heat dissipation from the semiconductor element 3. As can be understood from the present variation, the position of each of the recesses 125 relative to the fourth region 634 (third regions 633) in the y direction is not particularly limited.

FIG. 16 shows a third variation of the semiconductor device A1. A semiconductor device A13 of the present variation is different from the examples above in the shape of each of the recesses 125 as viewed in the z direction. In the present variation, each of the recesses 125 has a rectangular shape as viewed in the z direction.

The semiconductor device A13 of the present variation can also facilitate heat dissipation from the semiconductor element 3. As can be understood from the present variation, the shape of each of the recesses 125 is not particularly limited.

FIG. 17 shows a fourth variation of the semiconductor device A1. In a semiconductor device A14 of the present variation, the entirety of each recess 125 is covered with the resin section 6. Accordingly, in the present variation, each of the resin first side surfaces 63 does not have a fourth region 634.

The semiconductor device A14 of the present variation can also facilitate heat dissipation from the semiconductor element 3. The research by the present inventor shows that even if the whole of each recess 125 is covered with the resin section 6, it is possible to reduce the stress generated at the resin section 6 when the lead frame LF is cut in the manufacturing method shown in FIG. 13.

The semiconductor device according to the present disclosure is not limited to the above embodiments and variations. Various design changes can be made to the specific configurations of the elements of the semiconductor device according to the present disclosure. The present disclosure includes embodiments described in the following clauses.

Clause 1.

A semiconductor device comprising: a semiconductor element;

a first lead having a first section on which the semiconductor element is mounted;

a second lead spaced apart from the first lead and electrically connected to the semiconductor element; and a resin section covering the semiconductor element and a portion of each of the first lead and the second lead, wherein the first section has a first obverse surface and a first reverse surface facing away from each other in a thickness direction, the semiconductor element has an element obverse surface and an element reverse surface facing away from each other in the thickness direction, the element reverse surface faces the first obverse surface, the resin section has a resin obverse surface and a resin reverse surface facing away from each other in the thickness direction, the first reverse surface is exposed from the resin reverse surface, and an area ratio of the first reverse surface to an area of a region surrounded by an outer periphery edge of the resin reverse surface is between 40% and 50%, both inclusive.

Clause 2.

The semiconductor device according to clause 1, wherein the first lead has two second sections and two third sections, the two second sections flanking the first section in a first direction perpendicular to the thickness direction and being offset from the first section in a sense of the thickness direction in which the first obverse surface faces, each of the two third sections being located between the first section and one of the two second sections, and an angle formed by each of the two third sections and the first direction is between 50° and 70°, both inclusive.

Clause 3.

The semiconductor device according to clause 2, wherein each of the two second sections has a second obverse surface facing a same side as the first obverse surface in the thickness direction, and a second reverse surface facing a same side as the first reverse surface in the thickness direction, and a distance between the first reverse surface and the second obverse surface in the thickness direction is smaller than a distance between the first reverse surface and the element obverse surface.

Clause 4.

The semiconductor device according to clause 3, wherein the distance between the first reverse surface and the second obverse surface is at least 0.6 times and less than 1.0 times the distance between the first reverse surface and the element obverse surface.

Clause 5.

The semiconductor device according to clause 3 or 4, wherein the distance between the first reverse surface and the second obverse surface is 1.5 to 2.4 times a distance between the first reverse surface and the second reverse surface.

Clause 6.

The semiconductor device according to any of clauses 3 to 5, wherein the second lead is spaced apart from the first lead in a second direction perpendicular to the thickness direction and the first direction, and has a fourth section that is at least partially covered with the resin section, and a fifth section and a sixth section that are exposed from the resin section, the fourth section has a fourth obverse surface and a fourth reverse surface, the fourth obverse surface at least partially covered with the resin section and facing the same side as the first obverse surface in the thickness direction, the fourth reverse surface facing a same side as the first reverse surface in the thickness direction, the fourth obverse surface is offset from the first obverse surface in the sense of the thickness direction in which the first obverse surface faces, the fourth reverse surface is offset from the first reverse surface in the sense of the thickness direction in which the first obverse surface faces, the fifth section is located outward from the fourth section in the second direction, and is offset from the fourth section in a sense of the thickness direction in which the first reverse surface faces, the sixth section is located between the fourth section and the fifth section, and a distance between the first reverse surface and the fourth obverse surface in the thickness direction is smaller than the distance between the first reverse surface and the element obverse surface.

Clause 7.

The semiconductor device according to clause 6, wherein the distance between the first reverse surface and the fourth obverse surface in the thickness direction is at least 0.6 times and less than 1.0 times the distance between the first reverse surface and the element obverse surface.

Clause 8.

The semiconductor device according to clause 6 or 7, wherein the distance between the first reverse surface and the fourth obverse surface in the thickness direction is 1.5 to 2.4 times a distance between the first reverse surface and the fourth reverse surface.

Clause 9.

The semiconductor device according to any of clauses 6 to 8, further comprising a wire bonded to the element obverse surface and the fourth obverse surface.

Clause 10.

The semiconductor device according to any of clauses 6 to 9, wherein the resin section has two resin first side surfaces located between the resin obverse surface and the resin reverse surface and spaced apart from each other in the first direction, each of the two resin first side surfaces has a first region between the resin obverse surface and the second obverse surface in the thickness direction, a second region between the second reverse surface and the resin reverse surface in the thickness direction, and a third region between the second obverse surface and the second reverse surface in the thickness direction, and a size of the second region is smaller than a size of the first region in the thickness direction.

Clause 11.

The semiconductor device according to clause 10, wherein an angle formed by the second region and the thickness direction is in the range of 15° to 30°.

Clause 12.

The semiconductor device according to clause 10 or 11, wherein the resin section has two resin second side surfaces located between the resin obverse surface and the resin reverse surface and spaced apart from each other in the second direction, each of the two resin second side surfaces has a fifth region between the resin obverse surface and the fourth obverse surface in the thickness direction, a sixth region between the fourth reverse surface and the resin reverse surface in the thickness direction, and a seventh region between the fourth obverse surface and the fourth reverse surface in the thickness direction, and a size of the sixth region is smaller than a size of the fifth region in the thickness direction.

Clause 13.

The semiconductor device according to clause 12, wherein an angle formed by the sixth region and the thickness direction is in the range of 15° to 30°.

Clause 14.

The semiconductor device according to any of clauses 10 to 13, wherein each of the two second sections has a recess recessed from the second obverse surface in the thickness direction, and the recess overlaps with the third region of a corresponding one of the resin first side surfaces as viewed in the second direction.

Clause 15.

The semiconductor device according to clause 14, wherein each of the recesses is spaced apart from both ends of a corresponding one of the second sections in the second direction.

Clause 16.

The semiconductor device according to clause 14 or 15, wherein each of the two second sections has a second end surface exposed from the resin section and facing in the first direction, each of the two resin first side surfaces has a fourth region overlapping with the recess as viewed in the first direction, and the second end surface, the third region, and the fourth region are flush with each other.

Clause 17.

The semiconductor device according to clause 16, wherein a deepest section of the recess in the thickness direction is located inward from the fourth region in the first direction.

REFERENCE SIGNS

A1, A11, A12, A13, A14: Semiconductor device
1: First lead 2: Second lead
3: Semiconductor element 6: Resin section
7: Wire 10, 20: Lead
11: First section 12: Second section
13: Third section 21: Fourth section
22: Fifth section 23: Sixth section
31: Element obverse surface 32: Element reverse surface
39: Bonding member 61: Resin obverse surface
62: Resin reverse surface 63: Resin first side surface
64: Resin second side surface 111: First obverse surface
112: First reverse surface 120: Second section
121: Second obverse surface 122: Second reverse surface
123: Second end surface 125, 1250: Recess
211: Fourth obverse surface 212: Fourth reverse surface
215: Bonding section 216: Strip section
221: Fifth obverse surface 222: Fifth reverse surface
311: Electrode pad 631: First region
632: Second region 633: Third region
634: Fourth region 641: Fifth region
642: Sixth region 643: Seventh region
1251: Deepest section CL: Cut line
F: Frame
H0, H11, H12, H21, H22, H61, H62: Height
LF: Lead frame α1, α2, α3: Angle

The invention claimed is:

1. A semiconductor device comprising:

a semiconductor element;

a first lead having a first section on which the semiconductor element is mounted;

a second lead spaced apart from the first lead and electrically connected to the semiconductor element; and a resin section covering the semiconductor element and a portion of each of the first lead and the second lead, wherein the first section has a first obverse surface and a first reverse surface facing away from each other in a thickness direction, the semiconductor element has an element obverse surface and an element reverse surface facing away from each other in the thickness direction, the element reverse surface faces the first obverse surface, the resin section has a resin obverse surface and a resin reverse surface facing away from each other in the thickness direction, the first reverse surface is exposed from the resin reverse surface, an area ratio of the first reverse surface to an area of a region surrounded by an outer periphery edge of the resin reverse surface is between 40% and 50%, both inclusive, the first lead has two second sections flanking the first section in a first direction perpendicular to the thickness direction and being offset from the first section in a sense of the thickness direction in which the first obverse surface faces, each of the two second sections has a second obverse surface facing a same side as the first obverse surface in the thickness direction, and a second reverse surface facing a same side as the first reverse surface in the thickness direction, the resin section has two resin first side surfaces located between the resin obverse surface and the resin reverse surface and spaced apart from each other in the first direction, each of the two resin first side surfaces has a first region between the resin obverse surface and the second obverse surface in the thickness direction, a second region between the second reverse surface and the resin reverse surface in the thickness direction, and a third region between the second obverse surface and the second reverse surface in the thickness direction, each of the two second sections has a recess recessed from the second obverse surface in the thickness direction, and the recess overlaps with the third region of a corresponding one of the resin first side surfaces as viewed in a second direction perpendicular to the thickness direction and the first direction.

2. The semiconductor device according to claim 1, wherein the first lead has two third sections, each of the two third sections being located between the first section and one of the two second sections, and an angle formed by each of the two third sections and the first direction is between 50° and 70°, both inclusive.

3. The semiconductor device according to claim 2, wherein a distance between the first reverse surface and the second obverse surface in the thickness direction is smaller than a distance between the first reverse surface and the element obverse surface.

4. The semiconductor device according to claim 3, wherein the distance between the first reverse surface and the second obverse surface is at least 0.6 times and less than 1.0 times the distance between the first reverse surface and the element obverse surface.

5. The semiconductor device according to claim 3, wherein the distance between the first reverse surface and the second obverse surface is 1.5 to 2.4 times a distance between the first reverse surface and the second reverse surface.

6. The semiconductor device according to claim 3, wherein the second lead is spaced apart from the first lead in the second direction, and has a fourth section that is at least partially covered with the resin section, and a fifth section and a sixth section that are exposed from the resin section, the fourth section has a fourth obverse surface and a fourth reverse surface, the fourth obverse surface at least partially covered with the resin section and facing the same side as the first obverse surface in the thickness direction, the fourth reverse surface facing the same side as the first reverse surface in the thickness direction, the fourth obverse surface is offset from the first obverse surface in the sense of the thickness direction in which the first obverse surface faces, the fourth reverse surface is offset from the first reverse surface in the sense of the thickness direction in which the first obverse surface faces, the fifth section is located outward from the fourth section in the second direction, and is offset from the fourth section in a sense of the thickness direction in which the first reverse surface faces, the sixth section is located between the fourth section and the fifth section, and a distance between the first reverse surface and the fourth obverse surface in the thickness direction is smaller than the distance between the first reverse surface and the element obverse surface.

7. The semiconductor device according to claim 6, wherein the distance between the first reverse surface and the fourth obverse surface in the thickness direction is at least 0.6 times and less than 1.0 times the distance between the first reverse surface and the element obverse surface.

8. The semiconductor device according to claim 6, wherein the distance between the first reverse surface and the fourth obverse surface in the thickness direction is 1.5 to 2.4 times a distance between the first reverse surface and the fourth reverse surface.

9. The semiconductor device according to claim 6, further comprising a wire bonded to the element obverse surface and the fourth obverse surface.

10. The semiconductor device according to claim 6, wherein a size of the second region is smaller than a size of the first region in the thickness direction.

11. The semiconductor device according to claim 10, wherein an angle formed by the second region and the thickness direction is in a range of 15° to 30°.

12. The semiconductor device according to claim 10, wherein the resin section has two resin second side surfaces located between the resin obverse surface and the resin reverse surface and spaced apart from each other in the second direction, each of the two resin second side surfaces has a fifth region between the resin obverse surface and the fourth obverse surface in the thickness direction, a sixth region between the fourth reverse surface and the resin reverse surface in the thickness direction, and a seventh region between the fourth obverse surface and the fourth reverse surface in the thickness direction, and a size of the sixth region is smaller than a size of the fifth region in the thickness direction.

13. The semiconductor device according to claim 12, wherein an angle formed by the sixth region and the thickness direction is in a range of 15° to 30°.

14. The semiconductor device according to claim 1, wherein each of the recesses is spaced apart from both ends of a corresponding one of the second sections in the second direction.

15. The semiconductor device according to claim 1, wherein each of the two second sections has a second end surface exposed from the resin section and facing in the first direction, each of the two resin first side surfaces has a fourth region overlapping with the recess as viewed in the first direction, and the second end surface, the third region, and the fourth region are flush with each other.

16. The semiconductor device according to claim 15, wherein a deepest section of the recess in the thickness direction is located inward from the fourth region in the first direction.

17. The semiconductor device according to claim 1, wherein each of the two second sections has a second end surface facing in the first direction, and in each of the two second sections, the recess is open in the second end surface in the first direction.

18. The semiconductor device according to claim 1, wherein in each of the two second sections, the recess has a shape defined by an arc and a chord.

19. The semiconductor device according to claim 1, wherein each of the two second sections has a second end surface facing in the first direction, and in each of the two second sections, the recess has a deepest section in the thickness direction, the deepest section being positioned inward from the second end surface in the first direction.

20. The semiconductor device according to claim 1, wherein in each of the two second sections, the recess is filled with a portion of the resin section.

* * * * *